United States Patent
Zhu

(10) Patent No.: US 8,643,434 B2
(45) Date of Patent: Feb. 4, 2014

(54) ADJUSTABLE GAIN AUDIO POWER AMPLIFYING CIRCUIT

(75) Inventor: Guojun Zhu, Chengdu (CN)

(73) Assignee: IPGoal Microelectronics (Sichuan) Co., Ltd., Chengdu, Sichuan Province (CN)

( * ) Notice: Subject to any disclaimer, the term of this patent is extended or adjusted under 35 U.S.C. 154(b) by 51 days.

(21) Appl. No.: 13/494,991

(22) Filed: Jun. 13, 2012

(65) Prior Publication Data

US 2013/0106506 A1    May 2, 2013

(30) Foreign Application Priority Data

Oct. 31, 2011   (CN) .......................... 2011 1 0336186

(51) Int. Cl.
*H03F 3/45* (2006.01)
*H03G 3/20* (2006.01)

(52) U.S. Cl.
USPC ................ 330/69; 330/86; 330/136; 330/278

(58) Field of Classification Search
USPC ............... 330/69, 86, 136, 278, 279, 282, 28; 381/120, 121
See application file for complete search history.

(56) References Cited

U.S. PATENT DOCUMENTS

| | | | | |
|---|---|---|---|---|
| 7,265,626 B2* | 9/2007 | Teo et al. | ....................... | 330/279 |
| 7,795,967 B2* | 9/2010 | Nakai et al. | ................... | 330/129 |
| 7,965,142 B2* | 6/2011 | Tai | ................ | 330/279 |
| 8,093,944 B2* | 1/2012 | Liao | ............................... | 330/86 |
| 8,228,121 B2* | 7/2012 | Benhamouda et al. | ........ | 330/279 |

\* cited by examiner

*Primary Examiner* — Khanh V Nguyen

(57) ABSTRACT

An adjustable gain audio power amplifying circuit includes an input unit, an audio amplifying unit connected to the input unit, a gain adjusting unit connected to the audio amplifying unit, a controlling unit connected to the gain adjusting unit, a comparing unit connected between the gain adjusting unit and the controlling unit and an output unit connected to the audio amplifying unit. The comparing unit compares an outputted signal of the output unit with a common-mode reference voltage, outputs a gain adjustment controlling signal and sends the gain adjustment controlling signal into the controlling unit. When the outputted signal equals the common-mode reference voltage, the gain adjustment controlling signal turns over and then the controlling unit detects the turnover and sends a received gain adjustment signal into the gain adjusting unit. Based on the received gain adjustment signal, the gain adjusting unit controls gains of the adjustable gain audio power amplifying circuit.

10 Claims, 4 Drawing Sheets

ADJUSTABLE GAIN AUDIO POWER AMPLIFYING CIRCUIT

BACKGROUND OF THE PRESENT INVENTION

1. Field of Invention

The present invention relates to an amplifying circuit, and more particularly to an adjustable gain audio power amplifying circuit having an ability of zero-crossing detection.

2. Description of Related Arts

In an audio power amplifying circuit, signal transition always happens to outputted signals of the audio power amplifying circuit during adjusting gains, so that louderspeakers or earphones are readily impacted and produce crackling sounds to bring discomfort to sensitive ears. FIG. 1 shows a simulation waveform of the outputted signals of a conventional audio power amplifying circuit during adjusting the gains, by which it can be seen that an obvious transition happens to the outputted signals.

Thus it is necessary to provide an adjustable gain audio power amplifying circuit able to effectively suppress the crackling sounds caused by adjusting the gains to prevent the outputted signals of the audio power amplifying circuit to transit during adjusting the gains.

SUMMARY OF THE PRESENT INVENTION

Based on above description, it is necessary to provide an adjustable gain audio power amplifying circuit having an ability of zero-crossing detection.

An adjustable gain audio power amplifying circuit comprises an input unit, an audio amplifying unit connected to the input unit, a gain adjusting unit connected to the audio amplifying unit, a controlling unit connected to the gain adjusting unit, a comparing unit connected between the gain adjusting unit and the controlling unit and an output unit connected to the audio amplifying unit, wherein the comparing unit compares an outputted signal of the output unit with a common-mode reference voltage, outputs a gain adjustment controlling signal and sends the gain adjustment controlling signal into the controlling unit; once the outputted signal of the output unit equals the common-mode reference voltage, the gain adjustment controlling signal turns over and then the controlling unit detects the turnover of the gain adjustment controlling signal, receives a gain adjustment signal and sends the gain adjustment signal into the gain adjusting unit; and according to the received gain adjusting signal, the gain adjusting unit controls gains of the adjustable gain audio power amplifying circuit.

An adjustable gain audio power amplifying circuit comprises an input unit, an audio amplifying unit connected to the input unit, a gain adjusting unit connected to the audio amplifying unit, a controlling unit connected to the gain adjusting unit, a comparing unit connected between the input unit and the controlling unit and an output unit connected to the audio amplifying unit, wherein the comparing unit compares between a pair of differential signals, outputs a gain adjustment controlling signal and sends the gain adjustment controlling signal into the controlling unit; when the part of differential signals are equal to each other, the gain adjustment controlling signal turns over and then the controlling unit detects the turnover of the gain adjustment controlling signal, receives a gain adjustment signal and sends the gain adjustment signal into the gain adjusting unit; and based on the received gain adjusting signal, the gain adjusting unit controls gains of the adjustable gain audio power amplifying circuit.

Compared to conventional arts, the adjustable gain audio power amplifying circuit experiences no transition of the outputted signals of the audio power amplifying circuit during adjusting gains of the audio power amplifying circuit, has a simple structure and effectively suppresses crackling sounds caused by the gain adjustment.

These and other objectives, features, and advantages of the present invention will become apparent from the following detailed description, the accompanying drawings, and the appended claims.

DETAILED DESCRIPTION OF THE PREFERRED EMBODIMENT

Figure 1:
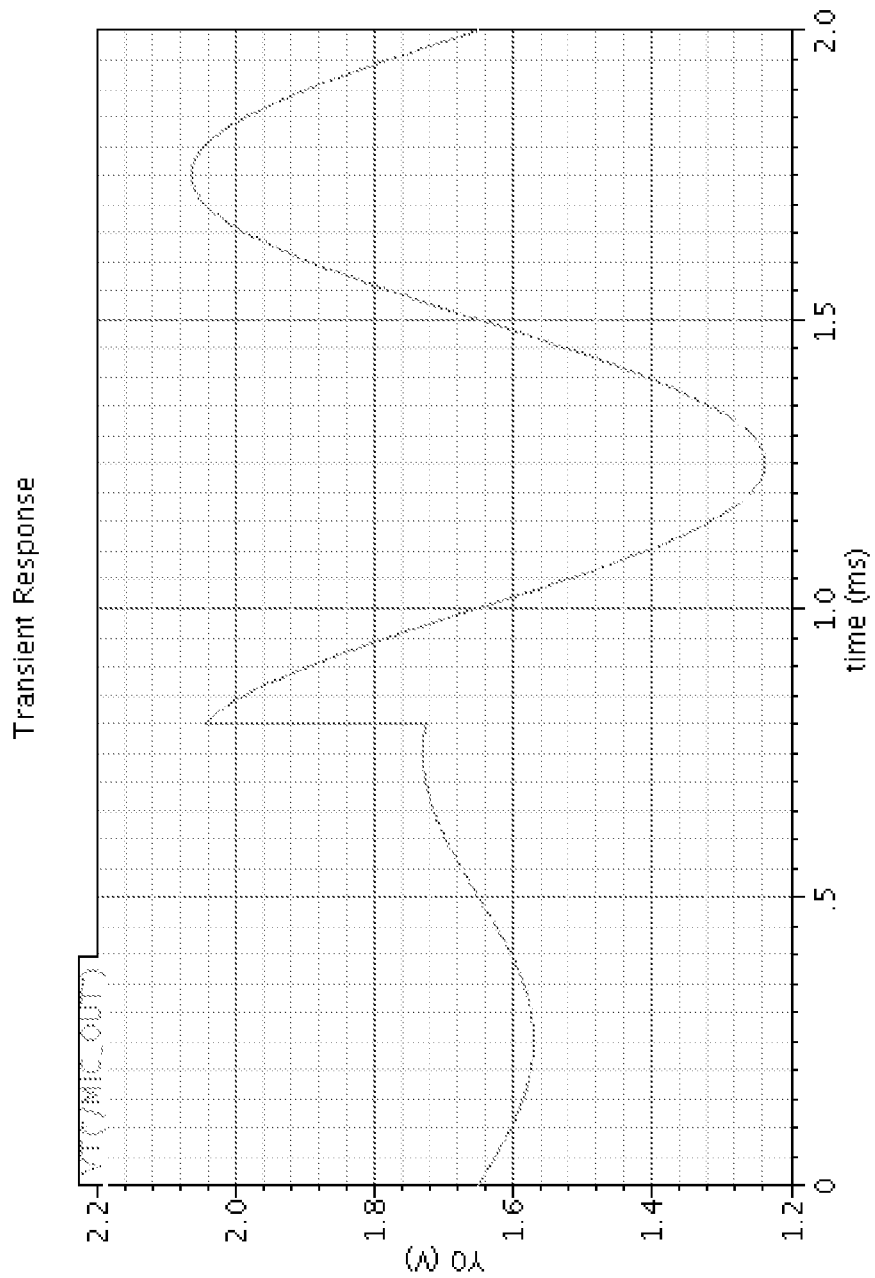
FIG. 1 is a simulation waveform of outputted signals of a conventional audio power amplifying circuit.
Figure 2:
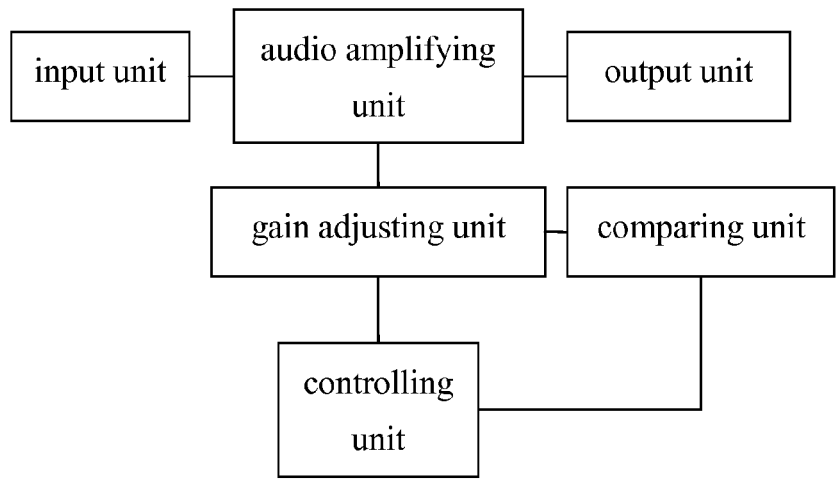
FIG. 2 is a block diagram of an adjustable gain audio power amplifying circuit according to a first preferred embodiment of the present invention.
Figure 3:
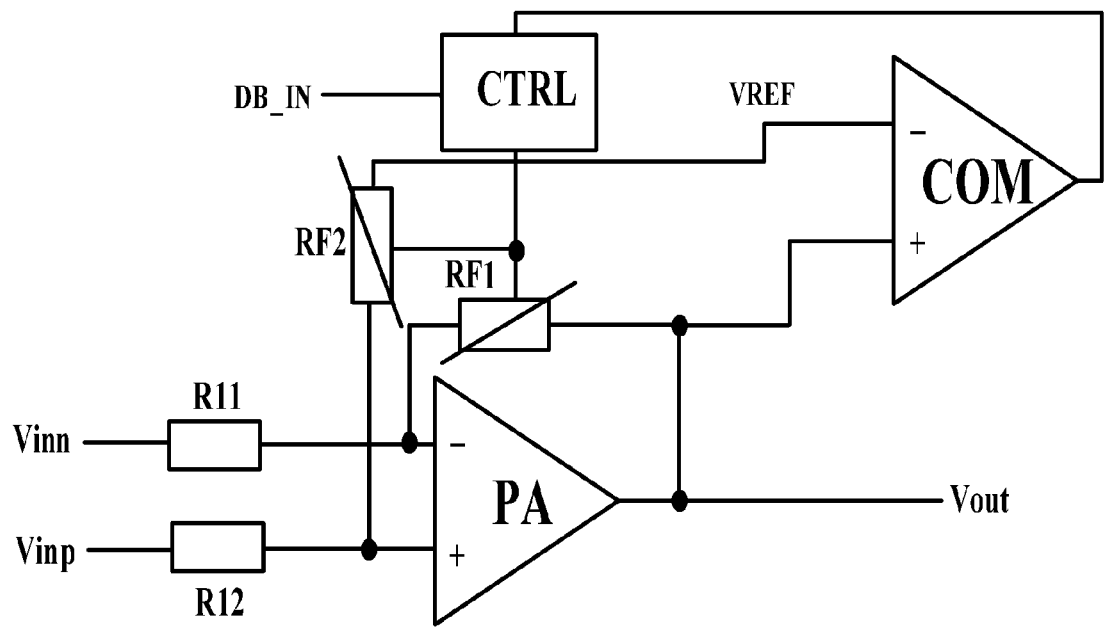
FIG. 3 is a sketch view of a circuit of the adjustable gain audio power amplifying circuit according to the first preferred embodiment of the present invention.

Referring to FIGS. 2 and 3 of the drawings, according to a first preferred embodiment of the present invention, an adjustable gain audio power amplifying circuit comprises an input unit, an audio amplifying unit connected to the input unit, a gain adjusting unit connected to the audio amplifying unit, a controlling unit connected to the gain adjusting unit, a comparing unit connected between the gain adjusting unit and the controlling unit and an output unit connected to the audio amplifying unit, wherein the input unit comprises a first input terminal Vinn, a second input terminal Vinp, a first resistance R11 and a second resistance R12; the audio amplifying unit is an audio amplifier PA; the gain adjusting unit comprises a first adjustable resistance RF1 and a second adjustable resistance RF2; the controlling unit is a gain controller CTRL; the comparing unit is a zero-crossing detection comparer COM; the output unit is an output terminal Vout.

The input unit is for inputting a pair of differential signals; the audio amplifying unit is for providing loudspeakers or earphones with enough driving power; the comparing unit is for comparing an outputted signal of the output unit with a common-mode reference voltage VREF, outputting a gain adjustment controlling signal and sending the gain adjustment controlling signal into the controlling unit; when the outputted signal of the output unit equals the common-mode reference voltage VREG, the gain adjustment controlling signal turns over; the controlling unit is for receiving an inputted gain adjustment signal DB_IN, detecting the turnover of the gain adjustment controlling signal outputted by the comparing unit and sending the gain adjustment signal DB_IN into the gain adjusting unit; based on the received gain adjustment signal DB_IN, the gain adjusting unit controls gains of the audio power amplifying circuit.

Because of limited gains of the zero-crossing detection comparer COM and an input offset voltage, when the gain of the audio power amplifying circuit is adjusted to be very tiny, such as −40 dB, an outputted signal magnitude of the audio power amplifying circuit is so small that the gain adjustment controlling signal outputted by the zero-crossing detection comparer COM is unable to turn over; and thus the adjustment of the gains becomes invalid, because the audio power amplifying circuit adjusts the gains based on the turnover of the gain adjustment controlling signal outputted by the zero-crossing detection comparer COM. As a result, the gain controller CTRL further counts the gain adjustment controlling signal outputted by the zero-crossing detection comparer COM; when the gain controller CTRL detects that the gain adjustment controlling signal outputted by the zero-crossing detection comparer COM experiences no turnover for a long time, such as 25 ms, the zero-crossing detection comparer COM is automatically turned off to avoid the invalidness of the gain adjustment.

According to the first preferred embodiment of the present invention, connection relationships of the adjustable gain audio power amplifying circuit are following. A first terminal of the first resistance R11 is connected to the first input terminal Vinn; a second terminal of the first resistance R11 is connected to a reversed input terminal of the audio amplifier PA and a first terminal of the first adjustable resistance RF1. A first terminal of the second resistance R12 is connected to the second input terminal Vinp; a second terminal of the second resistance R12 is connected to a non-inverting input terminal of the audio amplifier PA and a first terminal of the second adjustable resistance RF2. A second terminal of the first adjustable resistance RF1, an output terminal of the audio amplifier PA, a non-inverting input terminal of the zero-crossing detection comparer COM and the output terminal Vout are all connected with each other. A second terminal of the second adjustable resistance RF2 and a reversed input terminal of the zero-crossing detection comparer COM are connected with each other and receive the common-mode reference voltage VREF together. An output terminal of the zero-crossing detection comparer COM is connected to a controlling terminal of the gain controller CTRL. An input terminal of the gain controller CTRL is for receiving the inputted gain adjustment signal DB_IN. An output terminal of the gain controller CTRL is connected to a controlling terminal of the first adjustable resistance RF1 and a controlling terminal of the second adjustable resistance RF2.

According to the first preferred embodiment of the present invention, working principles of the adjustable gain audio power amplifying circuit are following. The first input terminal Vinn and the second input terminal Vinp input a pair of differential signals into the audio amplifier PA through the first resistance R11 and the second resistance R12; the zero-crossing detection comparer COM compares an outputted signal of the audio amplifier PA with the common-mode reference voltage VREF, outputs a gain adjustment controlling signal and sends the gain adjustment controlling signal into the gain controller CTRL; the gain controller CTRL receives an externally inputted gain adjustment signal DB_IN, detects a turnover of the gain adjustment controlling signal outputted by the zero-crossing detection comparer COM and sends the gain adjustment signal DB_IN into the first adjustable resistance RF1 and the second adjustable resistance RF2; based on the received gain adjustment signal DB_IN, the first adjustable resistance RF1 and the second adjustable resistance RF2 control gains of the audio power amplifying circuit.

When the gain controller CTRL detects that the gain adjustment controlling signal outputted by the zero-crossing detection comparer COM experiences no turnover for a predetermined long time, the zero-crossing detection comparer COM is automatically turned off to avoid an invalid gain adjustment.

Figure 4:
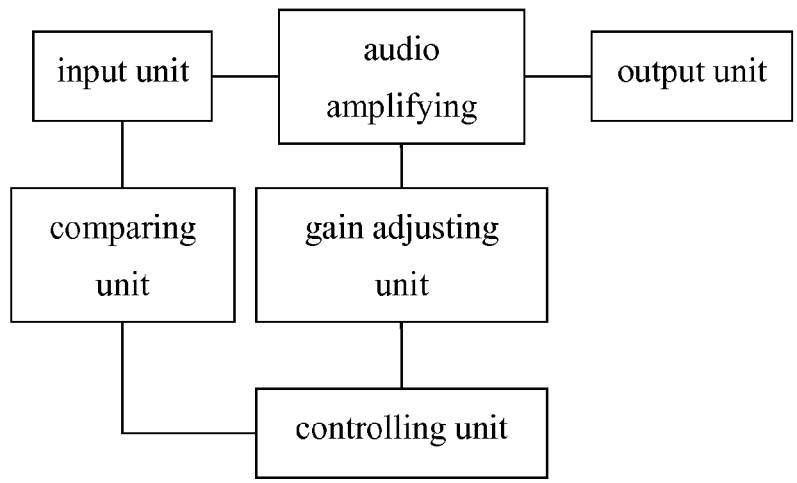
FIG. 4 is a block diagram of the adjustable gain audio power amplifying circuit according to a second preferred embodiment of the present invention.
Figure 5:
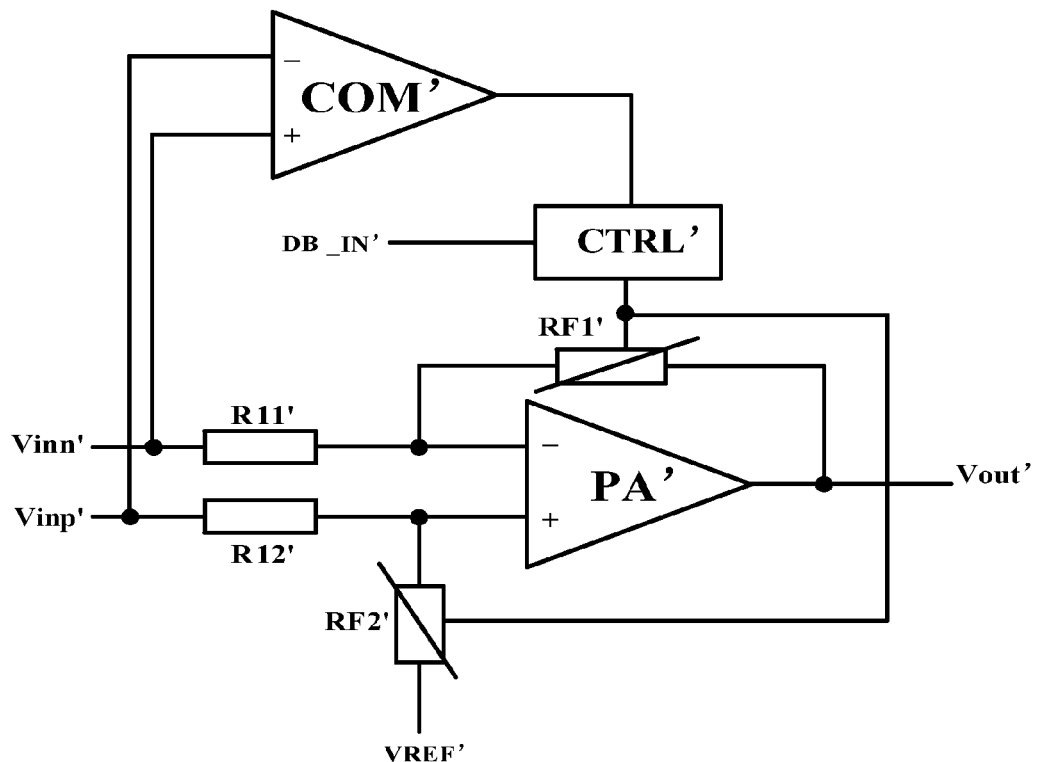
FIG. 5 is a sketch view of a circuit of the adjustable gain audio power amplifying circuit according to the second preferred embodiment of the present invention.

Referring to FIGS. 4 and 5, according to a second preferred embodiment of the present invention, a comparing unit is connected between an input unit and a controlling unit; the comparing unit is for comparing a pair of differential signals inputted by the input unit, outputting a gain adjustment controlling signal and sending the gain adjustment controlling signal into the controlling unit; when the pair of differential signals inputted by the input unit are equal to each other, the gain adjustment controlling signal turns over. The adjustable gain audio power amplifying circuit according to the second preferred embodiment has similar working principles with the adjustable gain audio power amplifying circuit according to the first preferred embodiment as showed in FIGS. 2 and 3. The input unit comprises a first input terminal Vinn', a second input terminal Vinp', a first resistance R11' and a second resistance R12'; the audio amplifying unit is an audio amplifier PA'; the gain adjusting unit comprises a first adjustable resistance RF1' and a second adjustable resistance RF2'; the controlling unit is a gain controller CTRL'; the comparing unit is a zero-crossing detection comparer COM'; the output unit is an output terminal Vout'.

According to the second preferred embodiment of the present invention, connection relationships of the adjustable gain audio power amplifying circuit are following. The first input terminal Vinn' is connected to a first terminal of the first resistance R11' and a non-inverting input terminal of the zero-crossing detection comparer COM'; a second terminal of the first resistance R11' is connected to a reversed input terminal of the audio amplifier PA' and a first terminal of the first adjustable resistance RF1'. The second input terminal Vinp' is connected to a first terminal of the second resistance R12' and a reversed input terminal of the zero-crossing detection comparer COM'; a second terminal of the second resistance R12' is connected to a non-inverting input terminal of the audio amplifier PA' and a first terminal of the second adjustable resistance RF2'. A second terminal of the first adjustable resistance RF1', an output terminal of the audio amplifier PA and the output terminal Vout' are all connected with each other. A second terminal of the second adjustable resistance RF2' is connected to the common-mode reference voltage terminal VREF'. An output terminal of the zero-crossing detection comparer COM' is connected to a controlling terminal of the gain controller CTRL'. An input terminal of the gain controller CTRL' is for receiving an inputted gain adjustment signal DB_IN'. An output terminal of the gain controller CTRL' is connected to a controlling terminal of the first adjustable resistance RF1' and a controlling terminal of the second adjustable resistance RF2'.

According to the second preferred embodiment of the present invention, the working principles of the adjustable gain audio power amplifying circuit are following. The first input terminal Vinn' and the second input terminal Vinp' input a pair of differential signals into the audio amplifier PA' through the first resistance R11' and the second resistance R12'; the zero-crossing detection comparer COM' compares the pair of the differential signals inputted by the first input terminal Vinn' and the second input terminal Vinp', outputs a gain adjustment controlling signal and sends the gain adjustment controlling signal into the gain controller CTRL'; the gain controller CTRL' receives an externally inputted gain adjustment signal DB_IN', detects a turnover of the gain adjustment controlling signal outputted by the zero-crossing detection comparer COM' and sends the gain adjustment signal DB_IN' into the first adjustable resistance RF1' and the second adjustable resistance RF2'; based on the received gain adjustment signal DB_IN', the first adjustable resistance RF1' and the second adjustable resistance RF2' control gains of the audio power amplifying circuit.

When the gain controller CTRL' detects that the gain adjustment controlling signal experiences no turnover for a predetermined long time, the zero-crossing detection comparer COM' is automatically turned off to avoid the invalid gain adjustment.

Figure 6:
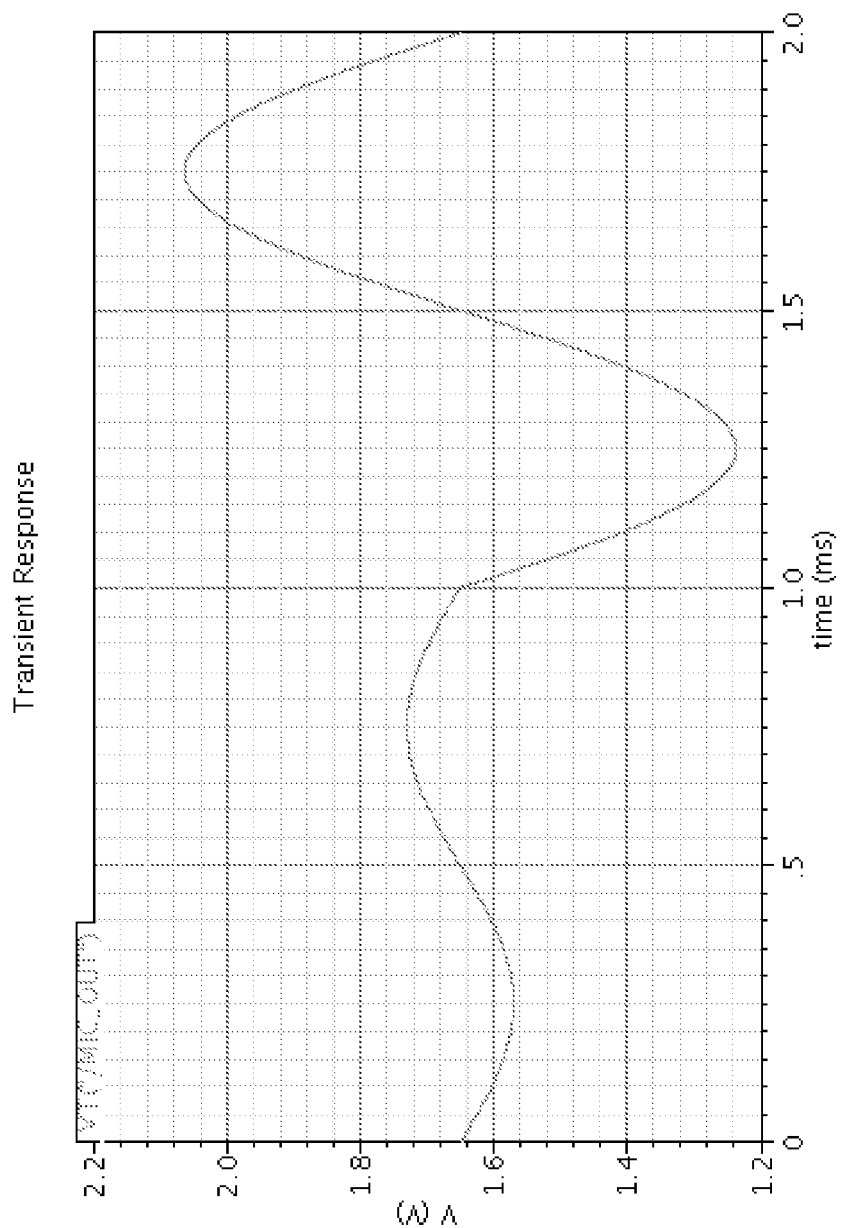
FIG. 6 is a simulation waveform of outputted signals of the adjustable gain audio power amplifying circuit according to the first preferred embodiment of the present invention.

FIG. 6 shows a simulation waveform of the outputted signals of the adjustable gain audio power amplifying circuit during adjusting the gains. According to the waveform, the outputted signals experience no transition during adjusting the gains of the adjustable gain audio power amplifying circuit, which means no crackling sound can be produced.

By a comparison between an outputted signal of the audio power amplifying circuit and the common-mode reference voltage, or between a pair of differential signals inputted by the audio power amplifying circuit, the adjustable gain audio power amplifying circuit of the present invention outputs a gain adjustment controlling signal to instruct timings of the gain adjustment of the audio power amplifying circuit. When the gain adjustment signal turns over, i.e., the outputted signal of the audio power amplifying circuit equals the common-mode reference voltage, or the pair of the differential signals inputted by the audio power amplifying circuit are equal, adjusting the gains leads to no transition of the outputted signal of the audio power amplifying circuit, so as to avoid the crackling sounds.

The adjustable gain audio power amplifying circuit of the present invention experiences no transition of the outputted signals of the audio power amplifying circuit during adjusting gains of the audio power amplifying circuit, has a simple structure and effectively suppresses the crackling sounds caused by the gain adjustment One skilled in the art will understand that the embodiment of the present invention as shown in the drawings and described above is exemplary only and not intended to be limiting.

It will thus be seen that the objects of the present invention have been fully and effectively accomplished. Its embodiments have been shown and described for the purposes of illustrating the functional and structural principles of the present invention and is subject to change without departure from such principles. Therefore, this invention includes all modifications encompassed within the spirit and scope of the following claims.

What is claimed is:

1. An adjustable gain audio power amplifying circuit comprising an input unit, an audio amplifying unit connected to said input unit, a gain adjusting unit connected to said audio amplifying unit, a controlling unit connected to said gain adjusting unit, a comparing unit connected between said gain adjusting unit and said controlling unit and an output unit connected to said audio amplifying unit, wherein said comparing unit is for comparing an outputted signal of said output unit with a common-mode reference voltage, outputting a gain adjustment controlling signal and sending the gain adjustment controlling signal into said controlling unit; when the outputted signal equals the common-mode reference voltage, the gain adjustment controlling signal turns over and then said controlling unit detects the turnover of the gain adjustment controlling signal, receives a gain adjustment signal and sends the gain adjustment signal into said gain adjusting unit; based on the received gain adjustment signal, said gain adjusting unit controls gains of said adjustable gain audio power amplifying circuit.

2. The adjustable gain audio power amplifying circuit, as recited in claim 1, wherein said input unit comprises a first input terminal, a second input terminal, a first resistance connected to said first input terminal and a second resistance connected to said second input terminal; said audio amplifying unit comprises an audio amplifier; said gain adjusting unit comprises a first adjustable resistance and a second adjustable resistance; said controlling unit comprises a gain controller; said comparing unit comprises a zero-crossing detection comparer; said output unit comprises an output terminal.

3. The adjustable gain audio power amplifying circuit, as recited in claim 2, wherein a first terminal of said first resistance is connected to said first input terminal; a second terminal of said first resistance is connected to a reversed input terminal of said audio amplifier and a first terminal of said first adjustable resistance; a first terminal of said second resistance is connected to said second input terminal; a second terminal of said second resistance is connected to a non-inverting terminal of said audio amplifier and a first terminal of said second adjustable resistance.

4. The adjustable gain audio power amplifying circuit, as recited in claim 3, wherein a second terminal of said first adjustable resistance, an output terminal of said audio amplifier, a non-inverting terminal of said zero-crossing detection comparer and said output terminal are all connected with each other; a second terminal of said second adjustable resistance and a reversed input terminal of said zero-crossing detection comparer are connected and receive the common-mode reference voltage together.

5. The adjustable gain audio power amplifying circuit, as recited in claim 1, wherein an output terminal of said zero-crossing detection comparer and a controlling terminal of said gain controller are connected; an input terminal of said gain controller is for receiving the gain adjustment signal; an output terminal of said gain controller is connected to a controlling terminal of said first adjustable resistance and a controlling terminal of said second adjustable resistance.

6. An adjustable gain audio power amplifying circuit comprises an input unit, an audio amplifying unit connected to said input unit, a gain adjusting unit connected to said audio amplifying unit, a controlling unit connected to said gain adjusting unit, a comparing unit connected between said input unit and said controlling unit and an output unit connected to said audio amplifying unit, wherein said comparing unit compares a pair of differential signals inputted by said input unit, outputs a gain adjustment controlling signal and sends the gain adjustment controlling signal into said controlling unit; when the pair of differential signals are equal, the gain adjustment controlling signal turns over and then said controlling unit detects the turnover of the gain adjustment controlling signal, receives a gain adjustment signal and sends the gain adjustment signal into said gain adjusting unit; based on the received gain adjustment signal, said gain adjusting unit controls gains of said adjustable gain audio power amplifying circuit.

7. The adjustable gain audio power amplifying circuit, as recited in claim 6, wherein said input unit comprises a first input terminal, a second input terminal, a first resistance connected to said first input terminal and a second resistance connected to said second input terminal; said audio amplifying unit comprises an audio amplifier; said gain adjusting unit comprises a first adjustable resistance and a second adjustable resistance; said controlling unit comprises a gain controller;

said comparing unit comprises a zero-crossing detection comparer; said output unit comprises an output terminal.

8. The adjustable gain audio power amplifying circuit, as recited in claim 7, wherein a first terminal of said first resistance and a non-inverting terminal of said zero-crossing detection comparer are connected to said first input terminal; a second terminal of said first resistance is connected to a reversed input terminal of said audio amplifier and a first terminal of said first adjustable resistance; a first terminal of said second resistance and a reversed input terminal of said zero-crossing detection comparer are connected to said second input terminal; a second terminal of said second resistance is connected to a non-inverting input terminal of said audio amplifier and a first terminal of said second adjustable resistance.

9. The adjustable gain audio power amplifying circuit, as recited in claim 8, wherein a second terminal of said first adjustable resistance, an output terminal of said audio amplifier and said output terminal are all connected with each other; a second terminal of said second adjustable resistance and a common-mode reference voltage terminal are connected with each other.

10. The adjustable gain audio power amplifying circuit, as recited in claim 9, wherein an output terminal of said zero-crossing detection comparer and a controlling terminal of said gain controller are connected with each other; an input terminal of said gain controller is for receiving the gain adjustment signal; an output terminal of said gain controller is connected to a controlling terminal of said first adjustable resistance and a controlling terminal of said second adjustable resistance.

* * * * *